(12) United States Patent
Kuo et al.

(10) Patent No.: US 6,713,315 B2
(45) Date of Patent: Mar. 30, 2004

(54) MASK READ-ONLY MEMORY AND FABRICATION THEREOF

(75) Inventors: Tung-Cheng Kuo, Yilan Hsien (TW); Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/134,270

(22) Filed: Apr. 25, 2002

(65) Prior Publication Data

US 2003/0178687 A1 Sep. 25, 2003

(30) Foreign Application Priority Data

Mar. 19, 2002 (TW) ....................................... 91105147 A

(51) Int. Cl.$^7$ ............................................... H01L 21/00
(52) U.S. Cl. .......................... 438/72; 438/636; 438/736; 257/437
(58) Field of Search .......................... 438/72, 275–278, 438/636, 736, 740; 257/437; 11/315

(56) References Cited

U.S. PATENT DOCUMENTS

| | | | | |
|---|---|---|---|---|
| 5,710,067 A | * | 1/1998 | Foote et al. | 438/636 |
| 5,977,601 A | * | 11/1999 | Yang et al. | 257/437 |
| 6,274,445 B1 | * | 8/2001 | Nouri | 438/300 |
| 2003/0100158 A1 | * | 5/2003 | Huang | 438/275 |

* cited by examiner

*Primary Examiner*—David Nelms
*Assistant Examiner*—Long Tran
(74) *Attorney, Agent, or Firm*—J. C. Patents

(57) ABSTRACT

A method for fabricating a Mask ROM is described, in which an ONO composite layer and a plurality of gate structures are formed on a substrate. A plurality of bit-lines are formed in the substrate between the gate structures and a plurality of word-lines are formed over the substrate to electrically connect with the gate structures. A chemical vapor deposition anti-reflective coating (CVD-ARC) with coding windows therein and an inter-layer dielectric layer are formed over the substrate. A coding process is then performed by using UV light to form a plurality of charged coding regions in the charge trapping layer not covered by the CVD-ARC. A plurality of plugs are then formed in the coding windows.

12 Claims, 9 Drawing Sheets

MASK READ-ONLY MEMORY AND FABRICATION THEREOF

CROSS-REFERENCE TO RELATED APPLICATION

This application claims the priority benefit of Taiwan application Ser. No. 91105147, filed Mar. 19, 2002.

BACKGROUND OF THE INVENTION

1. Field of Invention

The present invention relates to a structure of a read-only memory (ROM) and the fabrication thereof More particularly, the present invention relates to a structure of a mask read-only memory (Mask ROM) and the fabrication thereof.

2. Description of Related Art

The read-only memory (ROM) is non-volatile, which means that the data stored in it does not disappear when the power is switched off, and is therefore used in many electronic products for storing booting data and system parameters, etc. The simplest ROM is namely the Mask ROM, which uses MOS transistors as memory cells and is programmed by implanting ions into the channel regions of selected memory cells. The threshold voltages of the memory cells are therefore selectively changed and the On/Off states of the memory cells during a reading operation are thereby controlled.

A typical Mask ROM has a plurality of polysilicon word-lines (WL) crossing over a plurality of buried bit-lines in a substrate, whereby a channel region is defined in the substrate under a word-line and between two buried bit-lines. In some cases, the logic state of a Mask ROM cell is 0 or 1 dependent on the presence or the absence of the ions implanted, which is determined by a coding implantation process.

Refer to FIG. 1, FIG. 1 schematically illustrates a top view of a conventional Mask ROM. As that shown in FIG. 1, the Mask ROM has a plurality of parallel wordlines 102 crossing over a plurality of parallel buried bit-lines 104. The Mask ROM is programmed by implanting ions into a selected channel region 110 in the substrate to control the threshold voltage and the logic state of the selected Mask ROM cell.

Refer to FIG. 2, FIG. 2 schematically illustrates a coding process of the conventional Mask ROM in a cross-sectional view. As that shown in FIG. 2, a plurality of gate structures 206 each comprising a gate dielectric layer 202 and a gate conductive layer 204 are located on a substrate 200. A plurality of buried bit-lines 208 are located in the substrate 200 between the gate structures 206 and an insulating layer 210 is disposed covering the buried bit-lines 208. In a subsequent coding process, a patterned photoresist layer 212 not covering a selected channel region is formed over the substrate 200 by using a photo mask. An implantation 214 is then performed to dope the selected channel region with the photoresist layer 212 as a mask.

Since a conventional Mask ROM is programmed by selectively doping the channel regions of the memory cells in the front-end process described above, the fabricating process of the semi-finished Mask ROM products have to be stopped in the front-end process. Therefore, when an order is received, quite a few fabricating steps are required to finish the Mask ROM products before packing and delivering them to the client. Consequently, it takes much time to finish a conventional Mask ROM after an order is received and a special coding mask (e.g. a patterned photoresist layer) is needed for the coding implantation. Moreover, the opening in the patterned photoresist layer is easily mis-aligned with the selected channel region to cause data errors and therefore lower the reliability of the product.

SUMMARY OF THE INVENTION

Accordingly, this invention provides a Mask ROM and a method for fabricating a Mask ROM in order to prevent data errors in the Mask ROM.

This invention also provides a Mask ROM and a method for fabricating a Mask ROM in order to save a special coding mask.

This invention further provides a Mask ROM and a method for fabricating a Mask ROM in order to decrease the time required for finishing the product after an order is received.

In the method for fabricating a Mask ROM of this invention, a charge trapping layer (e.g., a silicon oxide/silicon nitride/silicon oxide (ONO) composite layer) and a plurality of gate structures are formed on a substrate, wherein the charge trapping layer under each gate structure serves as a predetermined coding region. A plurality of bitlines are formed in the substrate between the gate structures and a plurality of wordlines are formed over the substrate to electrically connect with the gate structures. An material layer capable of blocking UV light (e.g., a chemical vapor deposition antireflective coating (CVD-ARC)) having coding windows therein and an inter-layer dielectric layer are formed over the substrate. A coding process is then performed by using UV light to form a plurality of charged coding regions in the charge trapping layer under the coding windows. A plurality of plugs are then formed in the coding windows.

The Mask ROM of this invention comprises a substrate, a charge trapping layer, a plurality of gate structures, a plurality of bit-lines, a plurality of word-lines, a material layer capable of blocking UV light (e.g., a CVD-ARC), an inter-layer dielectric layer, and a plurality of plugs. The charge trapping layer is located on the substrate and the gate structures are located on the charge trapping layer, wherein the charge trapping layer under each gate structure serves as a coding region. The bit-lines are located in the substrate between the gate structures. The word-lines are located over the substrate and are electrically connected with the gate structures. The material layer is located over the substrate and the inter-layer dielectric layer is located on the material layer. The plugs are embedded in the inter-layer dielectric layer and the material layer and are located over some of the coding regions.

In the Mask ROM process of this invention, the charge trapping layer is used as the coding regions, the material layer capable of blocking UV light as a coding mask, and UV light as a programming tool. When the coding windows are being formed in the inter-layer dielectric layer and the material layer, contact holes can be form simultaneously in the inter-layer dielectric layer in a periphery region of the Mask ROM. Therefore, the coding window process can be integrated with the contact hole process and a special coding mask (e.g. a patterned photoresist layer) can be saved to reduce the production time and the production cost.

Moreover, since the coding window process can be integrated with the contact hole process in this invention, the Mask ROM process can be stopped before the contact hole process (a back-end process). After an order is received, the contact hole process and the coding window process are performed simultaneously. Consequently, the time required for finishing the products after an order is received can be reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
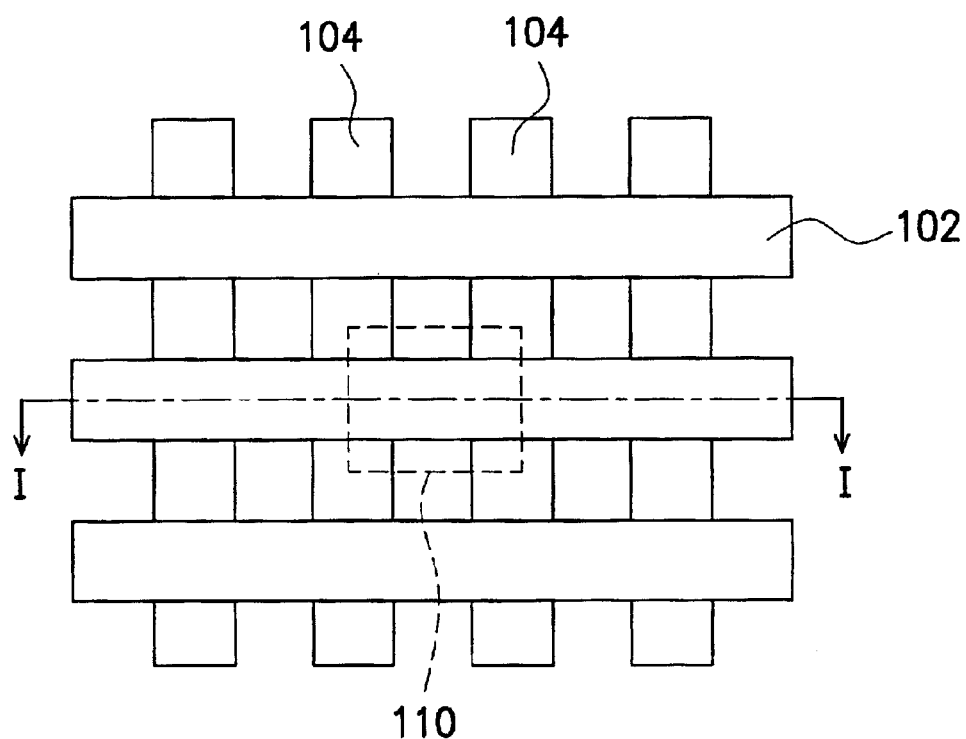
FIG. 1 illustrates a top view of a conventional Mask ROM.
Figure 2:
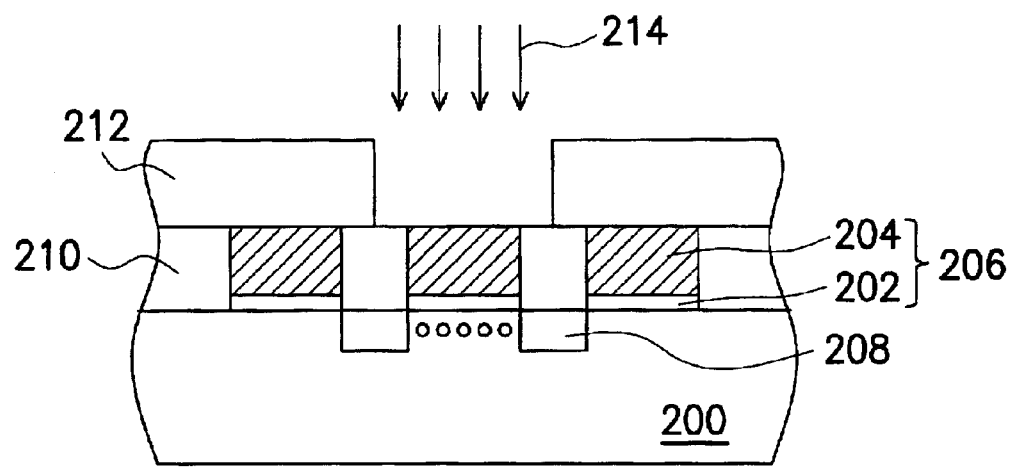
FIG. 2 illustrates the programming process of a conventional Mask ROM in a cross-sectional view.
Figure 3A:
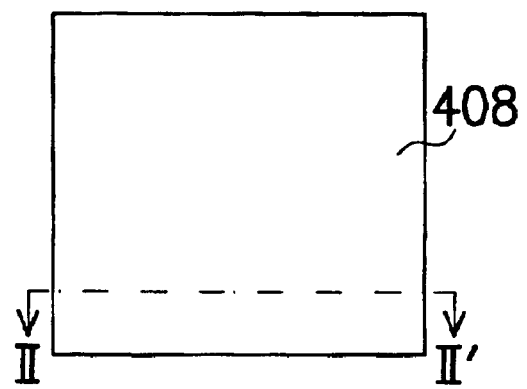
FIGS. 3A~3G schematically illustrate a process flow of fabricating a Mask ROM according to a preferred embodiment of this invention in a top view.
Figure 4A:
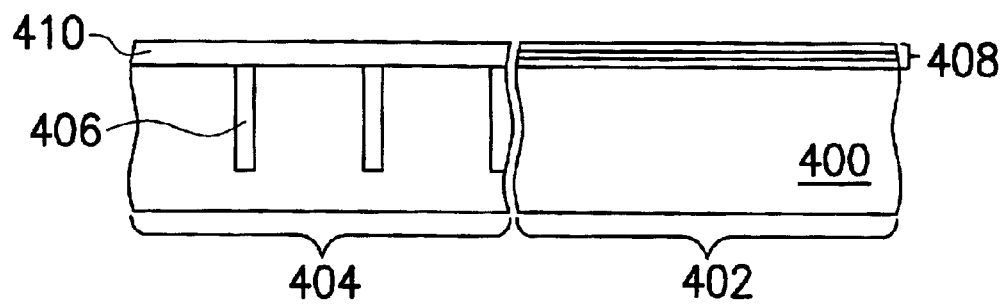
FIGS. 4A~4G schematically illustrate a process flow of fabricating a Mask ROM according to the preferred embodiment of this invention in a cross-sectional view, wherein the right half portion (402) of FIGS. 4A (4B, . . . , or 4G) is a cross-sectional view of the structure in FIGS. 3A (3B, . . . , or 3G) along the line II–II'.

Refer to FIGS. 3A and 4A, a substrate 400 having a memory region 402 and a periphery region 404 is provided, which is, for example, a silicon substrate.

Refer to FIG. 4A, a plurality of isolation structures 406 are then formed in the substrate 400 in the periphery region 404. The isolation structures 406 are formed as shallow trench isolations (STI) in this case, but can be formed as local oxidation (LOCOS) isolations instead in other cases.

Thereafter, a charge trapping layer 408 and a gate dielectric layer 410 are formed on the memory region 402 and on the periphery region 404, respectively. The charge trapping layer 408 comprises, for example, an ONO layer and the gate dielectric layer 410 comprises, for example, silicon oxide and is formed by a method such as thermal oxidation. In order to form two different layers on the two regions, respectively, one can form a gate dielectric layer 410 on the periphery region 404 with the memory region 402 being covered by a mask layer and then form a charge trapping layer 408 on the memory region 402 with the periphery region 404 being covered by another mask layer. Besides, one can readily reverse the order of forming the gate dielectric layer 410 and forming the charge trapping layer 408.

Figure 3B:
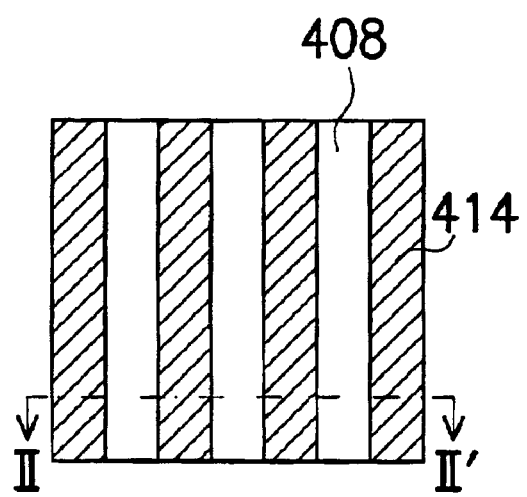
Figure 4B:
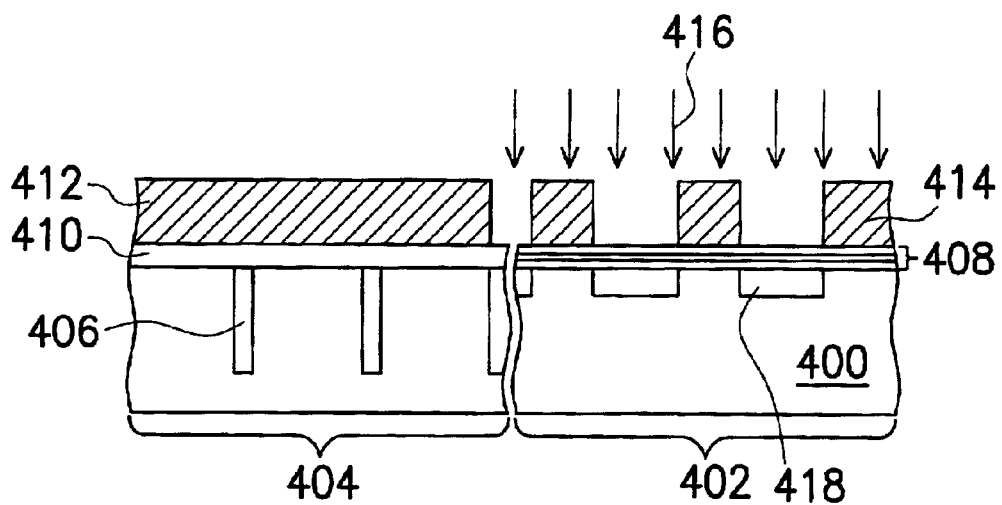

Refer to FIGS. 3B and 4B, a conductive layer 412, such as a polysilicon layer, is formed on the substrate 400 by, for example, chemical vapor deposition with in-situ doping. A lithography process and an etching process are then performed to pattern the conductive layer 412 to form a plurality of conductive bars 414 on the memory region 402, wherein each conductive bar 414 will be patterned into a plurality of gates later.

Subsequently, an implantation 416, which may use an N-type ion, is conducted to form a plurality of bit-lines 418 in the substrate 400 with the conductive bars 414 as a mask. After the implantation 416, a rapid thermal annealing (RTA) can be performed to repair the damaged lattice in the substrate 400.

Figure 3C:
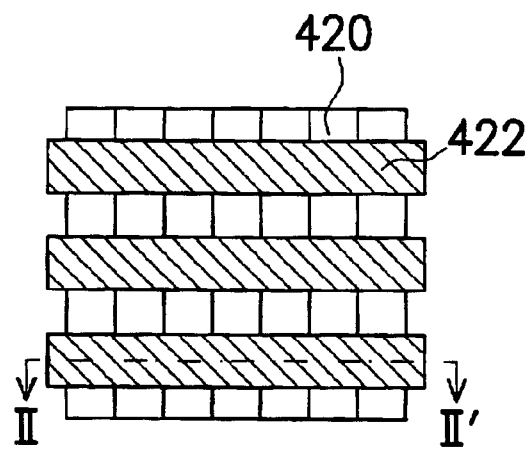
Figure 4C:
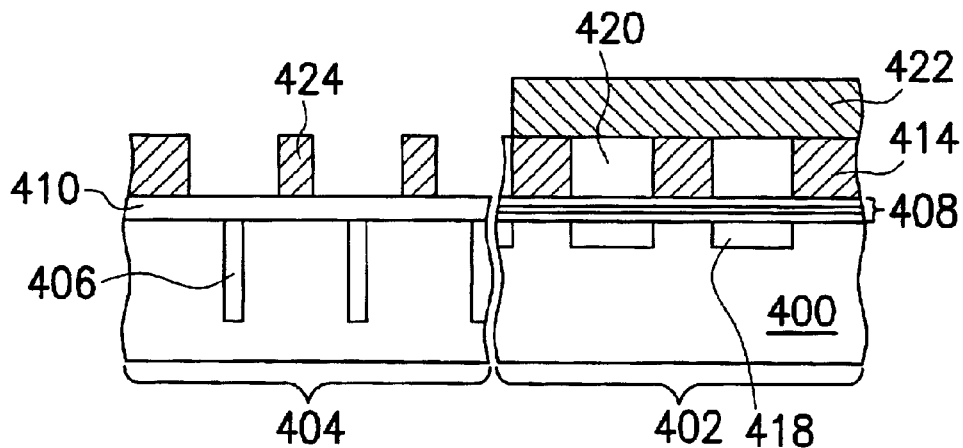

Refer to FIGS. 3C and 4C, an insulating layer 420 is the formed on the memory region 402 to fill the gaps between the conductive bars 414. The insulating layer 420 comprises, for example, silicon oxide and is formed by, for example, using CVD to deposit a silicon oxide layer on the substrate 400 and then performing etching-back or chemical mechanical polishing (CMP) to the silicon oxide layer until the conductive bars 414 is exposed.

Thereafter, another conductive layer (not shown), such as a doped polysilicon layer, is formed over the substrate 400 by, for example, CVD with in-situ doping. A lithography process and an etching process are then performed to successively pattern the conductive layer and the conductive bars 414 into a plurality of word-lines 422 and a plurality of gate structures 414, respectively, in the memory region 402. Meanwhile, the conductive layer 412 in the periphery region 404 is patterned into a plurality of gate structures 424. The word-lines 422 electrically connect with the gate structures 414 and cross over the bit-lines 418. In addition, a gate structure 414, a charge trapping layer 408, a word-line 422 and two bit-lines 418 together construct a memory cell.

Figure 3D:
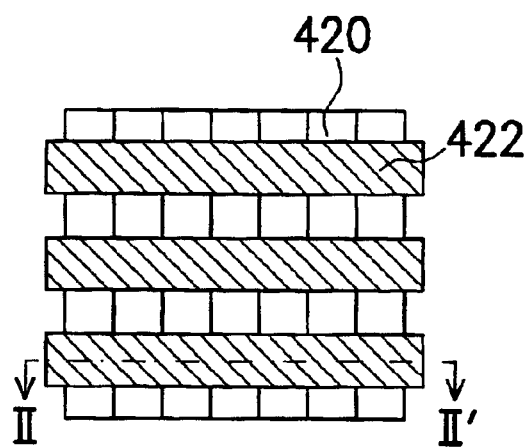
Figure 4D:
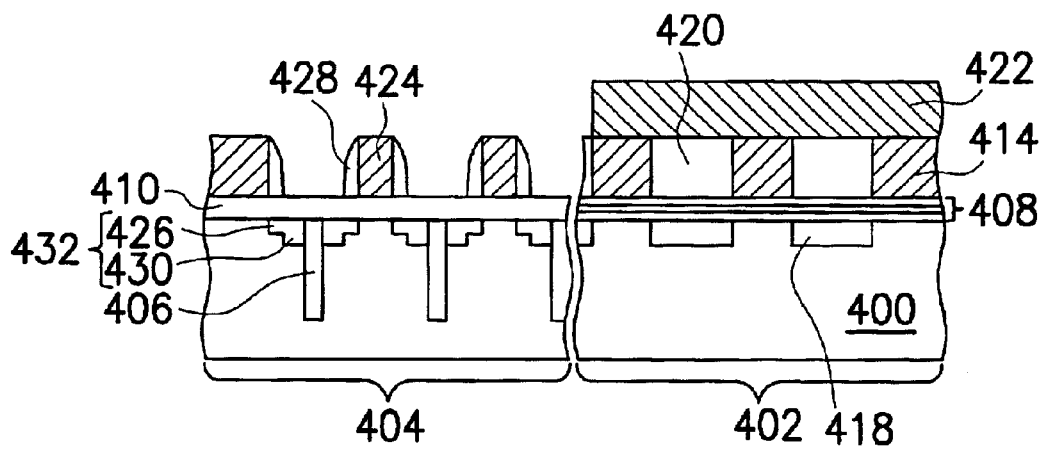

Refer to FIGS. 3D and 4D, an implantation is then performed to form a lightly doped region 426 in the substrate 400 beside the gate structure 424 in the periphery region 404 with the gate structure 424 as a mask.

A dielectric layer (not shown), such as a silicon oxide layer or a silicon nitride layer, is then formed on the substrate 400 by, for example, chemical vapor deposition (CVD). A portion of the dielectric layer is removed by anisotropic etching to leave a spacer 428 on the side-walls of the gate structure 424.

An implantation is then performed to form a heavily doped region 430 in the substrate 400 beside the gate structure 424 in the periphery region 404 with the spacers 428 and the gate structures 424 as a mask. The heavily doped region 430 and the lightly doped region 426 together serve as a source/drain region 432.

Figure 3E:
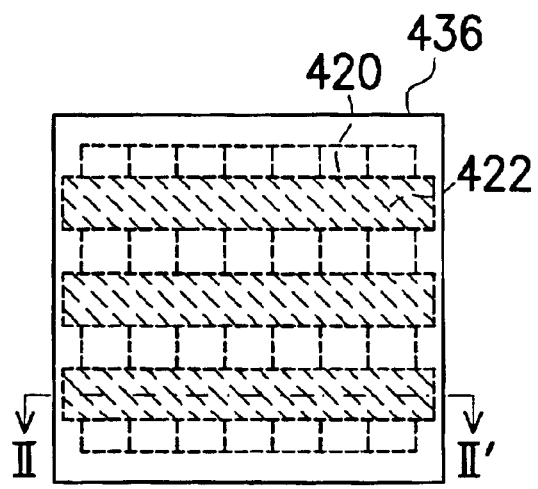
Figure 4E:
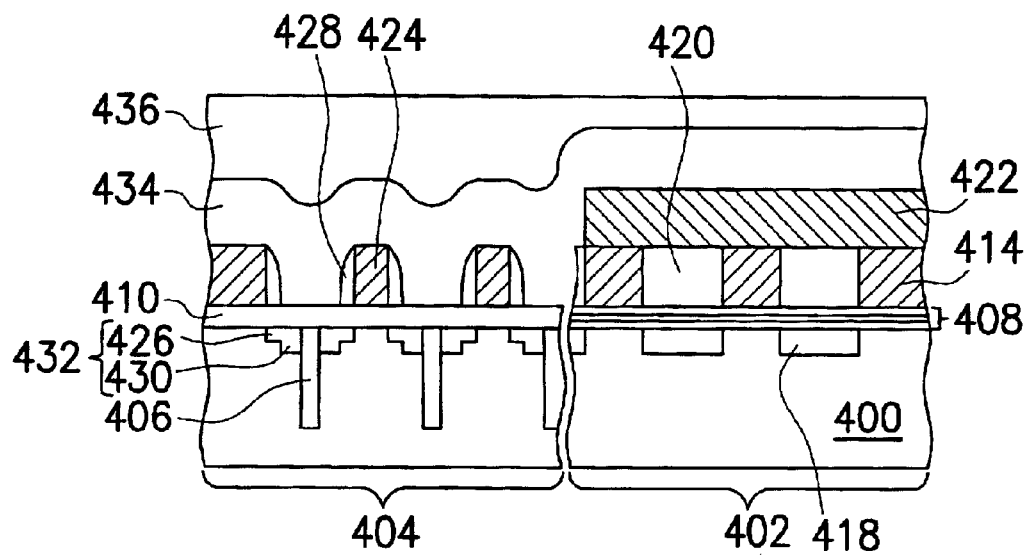

Refer to FIGS. 3E and 4E, a material layer 434 capable of blocking UV light is formed over the substrate 400. The material layer 434 comprises, for example, a chemical vapor deposition anti-reflective coating (CVD-ARC), which comprises material such as $Si_xN_y(OH)_z$.

An inter-layer dielectric layer 436 is then formed on the material layer 434. The inter-layer dielectric layer 436 is, for example, a silicon oxide layer formed by plasma enhanced chemical vapor deposition (PECVD) with tetraethyl-orthosilicate (TEOS) and ozone ($O_3$) as reaction gases. The inter-layer dielectric layer 436 is then planarized by, for example, chemical mechanical polishing (CMP) or etching-back.

Figure 3F:
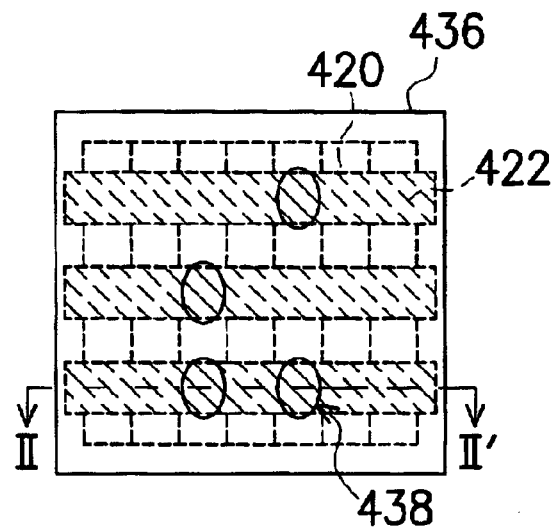
Figure 4F:
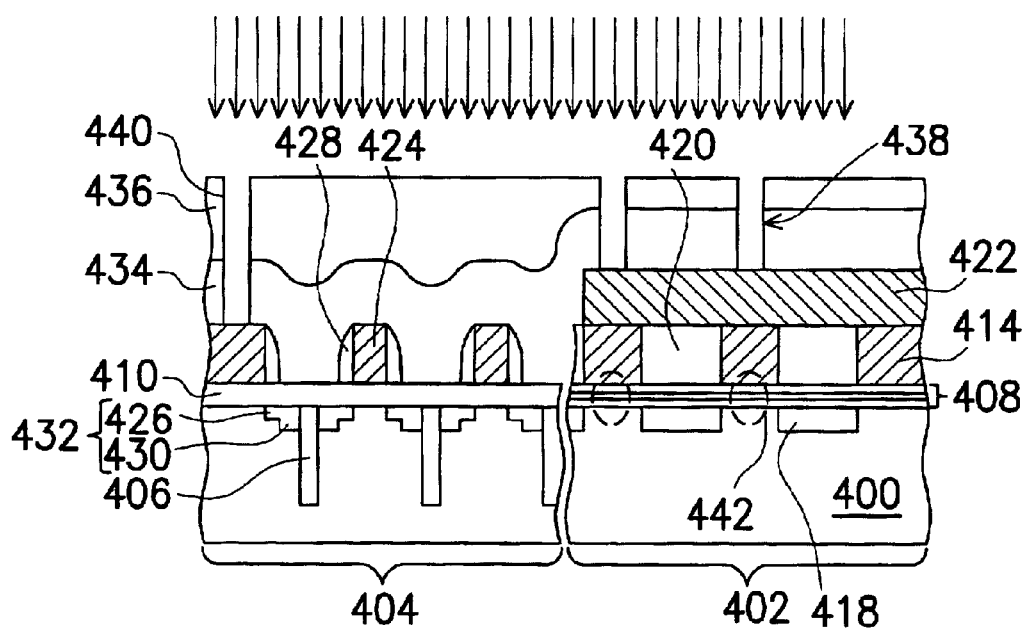

Refer to FIGS. 3F and 4F, a lithography process and an etching process are performed to pattern the inter-layer dielectric layer 436 and the material layer 434. A coding window 438 is thereby formed over selected memory cells in the memory region 402 and a contact hole 440 is formed over a gate structure 424 in the periphery region 404.

In the subsequent coding process, the substrate 400 is irradiated with UV light to inject electrons into the charge trapping layers 408 of the memory cells under the coding windows 438 to form a plurality of charged coding regions 442. The threshold voltages of the selected memory cells are thereby changed.

Figure 3G:
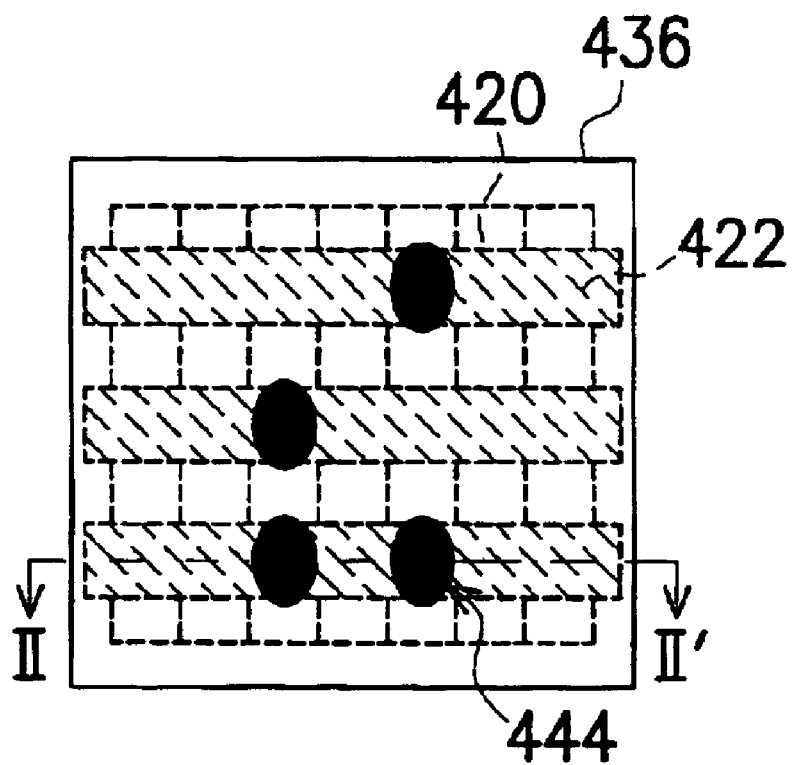
Figure 4G:
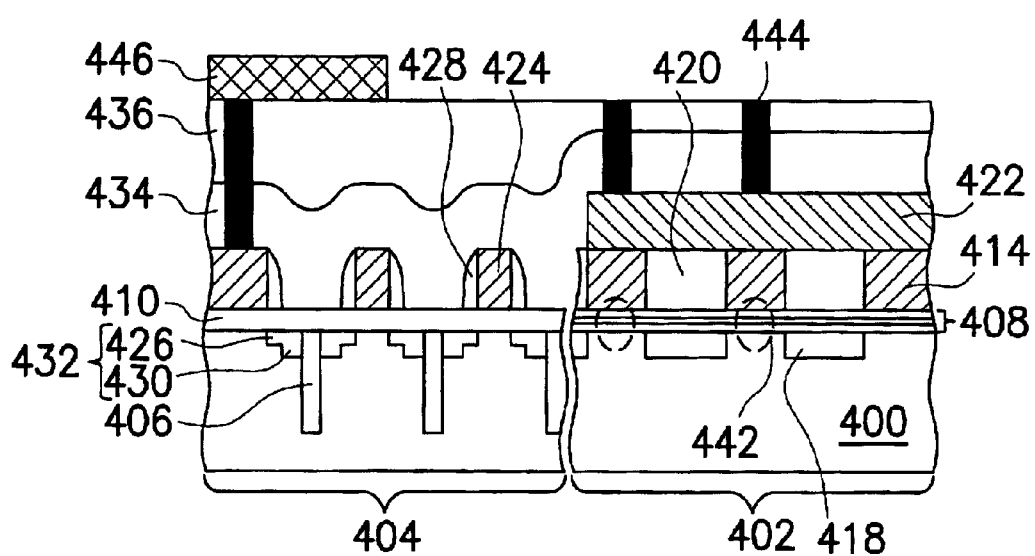

Refer to FIGS. 3G and 4G, a conductive layer (not shown) is formed over the substrate 400 to fill the coding windows 438 and the contact hole 440. The conductive layer outside the coding windows 438 and the contact hole 440 is then removed to form a plug 444. Thereafter, another conductive layer (not shown) is formed over the substrate 400 and then patterned into an interconnect 446 electrically connecting with the plug 444 in the periphery region 404.

The structure of the Mask ROM according to the preferred embodiment of this invention is described below.

Refer to FIG. 4G again, the Mask ROM comprises a substrate 400, a charge trapping layer 408, a plurality of gate structures 414, a plurality of bit-lines 418, a plurality of word-lines 422, a material layer 434 capable of blocking UV light and an inter-layer dielectric (ILD) layer 436. The charge trapping layer 408, such as an ONO layer, is located on the substrate 400 and the gate structures 414 are located on the charge trapping layer 408. The bit-lines 418 are located in the substrate 400 between the gate structures 414. The word-lines 422 cross over the bit-lines 418 and electrically connect with the gate structures 414. The material layer 434 is located over the substrate 400 and the inter-layer dielectric layer 436 is located on the material layer 434. In addition, a plug 444 is embedded in the inter-layer dielectric layer 436 and the material layer 434 over a charged coding region 442.

In summary, the Mask ROM process of this invention forms a material layer capable of blocking UV light as a coding mask layer and then forms coding windows in the material layer. When UV light is employed to the substrate, electron-hole pairs are generated in the substrate under the coding windows and electrons are injected into the charge trapping layers under the coding windows. A charge trapping layer with injected electrons will cause a higher threshold voltage, so that the programming process is done.

Since the coding window process is integrated with the contact hole process (see FIG. 4F) in the preferred embodiment of this invention, a special coding mask can be saved to reduce the production time and the production cost.

Moreover, since the coding window process can be integrated with the contact hole process in this invention, the Mask ROM process can be stopped before the contact hole process (a back-end process). After an order is received, the contact hole process and the coding window process are performed simultaneously. Consequently, the time required for finishing the products after an order is received can be reduced.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a Mask ROM, comprising the steps of:
    forming a silicon oxide/silicon nitride/silicon oxide (ONO) composite layer on a substrate;
    forming a plurality of gate structures on the ONO composite layer, wherein the ONO composite layer between each gate structure and the substrate serves as a predetermined coding region;
    forming a plurality of bit-lines in the substrate between the gate structures;
    forming a plurality of word-lines over the substrate to electrically connect with the gate structures;
    forming a chemical vapor deposition anti-reflective coating (CVD-ARC) over the substrate;
    forming an inter-layer dielectric layer on the chemical vapor deposition anti-reflective coating (CVD-ARC);
    forming a plurality of coding windows in the inter-layer dielectric layer and the chemical vapor deposition anti-reflective coating (CVD-ARC) over selected predetermined coding regions;
    performing a coding process by using UV light to inject charges into the selected predetermined coding regions with the chemical vapor deposition anti-reflective coating (CVD-ARC) as a mask; and
    forming a plurality of plugs in the coding windows.

2. The method of claim 1, wherein the chemical vapor deposition anti-reflective coating (CVD-ARC) comprises $Si_xN_y(OH)_z$.

3. The method of claim 1, further comprising forming a dielectric layer on the substrate to fill gaps between the gate structures.

4. The method of claim 1, wherein forming the bit-lines comprises:
    performing an implantation to dope the substrate between the gate structures; and
    performing an annealing process.

5. The method of claim 1, wherein the CVD-ARC is fanned covering the word lines and the plurality of the gate structures.

6. A method for fabricating a Mask ROM, comprising the steps of:
    forming a charge trapping layer on a substrate;
    forming a plurality of gate structures on the charge trapping layer, wherein the charge trapping layer between each gate structure and the substrate serves as a predetermined coding region;
    forming a plurality of bit-lines in the substrate between the gate structures;
    forming a plurality of word-lines over the substrate to electrically connect with the gate structures;
    forming a material layer capable of blocking UV light over the substrate;
    forming an inter-layer dielectric layer on the material layer;
    forming a plurality of coding windows in the inter-layer dielectric layer and the material layer over selected predetermined coding regions;
    performing a coding process by using UV light to inject charges into the selected predetermined coding regions with the material layer as a mask; and
    forming a plurality of plugs in the coding windows.

7. The method of claim 6, wherein the material layer comprises a chemical vapor deposition anti-reflective coating (CVD-ARC).

8. The method of claim 7, wherein the chemical vapor deposition anti-reflective coating (CVD-ARC) comprises $Si_xN_y(OH)_z$.

9. The method of claim 6, wherein the charge trapping layer comprises a silicon oxide/silicon nitride/silicon oxide (ONO) composite layer.

10. The method of claim 6, further comprising forming a dielectric layer on the substrate to fill gaps between the gate structures.

11. The method of claim 6, wherein forming the bit-lines comprises:
    performing an implantation to dope the substrate between the gate structures; and
    performing an annealing process.

12. The method of claim 6, wherein the material layer is formed covering the word-lines and the plurality of the gate structures.

* * * * *